AUTOMATIC GAIN CONTROL EMPLOYING PHOTORESISTORS

Original Filed Sept. 29, 1965 3 Sheets-Sheet 1

INVENTORS
Paul E. Carroll,
Milton C. Clerc

BY
Stevens, Davis, Miller & Mosher
ATTORNEYS

AUTOMATIC GAIN CONTROL EMPLOYING PHOTORESISTORS

Original Filed Sept. 29, 1965 3 Sheets-Sheet 2

INVENTORS
Paul E. Carroll,
Milton C. Clerc

BY
Stevens, Davis, Miller & Mosher
ATTORNEYS

INVENTORS
Paul E. Carroll,
Milton C. Clerc
BY
Stevens, Davis, Miller & Mosher
ATTORNEYS United States Patent Office 3,379,991
Patented Apr. 23, 1968

3,379,991
AUTOMATIC GAIN CONTROL EMPLOYING PHOTORESISTORS

Milton C. Clerc, Weequahic Park Tower, 455 Elizabeth Ave., Apt. L-5, Newark, N.J. 07112, and Paul E. Carroll, 7102 Leader, Houston, Tex. 77036

Continuation of application Ser. No. 491,361, Sept. 29, 1965. This application May 15, 1967, Ser. No. 638,667
1 Claim. (Cl. 330—59)

This is a continuation of application Ser. No. 491,361, filed Sept. 29, 1965, which application was a continuation of application Serial No. 117,325 filed June 15, 1961. The present invention relates to the gain control of amplifiers and more particularly to an automatic gain control system wherein a photoresistive element is used as a variable electronic attenuator for controlling the gain of an amplifier.

In most amplifier applications, the signal frequency is much higher than the frequency at which the automatic gain control voltage varies. Because of the great difference in the frequencies of the controlled voltage and the controlling voltage, any undesired fluctuations in the controlling voltage may be filtered out. It is common practice in most AGC (Automatic Gain Control) circuits to utilize a variable mu tube to accomplish the desired AGC function.

On the other hand, seismic amplifiers normally operate at signal frequencies very close to the rate of change of the AGC signal, and it is not possible to filter out the undesired variations in the AGC signal. These variations in the AGC signal commonly take one or both of two forms. Either an unstable condition is established in the AGC loop that produces oscillations which appear at the output of the amplifier although not present in the input signal, or the variations in the AGC signal may produce a low frequency nonsymmetrical wave that is modulated by the desired signal frequency. This last condition is usually referred to as axis shift.

Because of the aforementioned factors, it is impossible to utilize variable mu tubes in seismic amplifiers to achieve automatic gain control, except at very slow AGC speeds. In order to achieve some isolation, most present day seismic amplifiers utilize some form of bridge balance system utilizing either vacuum diodes or semiconductor diodes to achieve the desired attenuation. There are, however, certain inherent disadvantages in using diode attenuators. One important limitation on the use of diodes as attenuators is that if the signal level across the diode is more than a few millivolts, distortion is produced by generation of odd harmonics of the signal frequency if the diodes are exactly balanced. If the diodes aren't balanced, even harmonics may also be generated. This creates a signal-to-noise problem in that a certain amount of thermal noise is always present in any system and the limitation on the permissible signal level that many be employed without producing distortion limits the maximum possible signal-to-noise ratio.

Still another disadvantage of the diode attenuator as used in a bridge-type circuit is that it is necessary to utilize components which are evenly matched over a large range of currents to minimize axis shift. It is also necessary to select the diodes used to provide the desired AGC speed. The AGC expansion speed may vary from a high of 1000 db per second to a low of 20 db per second in seismic systems. Thus, even the better of the present day systems is subject to many limitations.

The present invention eliminates the above-mentioned problems associated with the prior art AGC systems for seismic amplifiers by providing complete isolation between the controlled and the controlling signal. This is accomplished by utilizing a photoresistive element as the variable electronic attenuator. Variations in the output voltage are reflected by variations in the intensity of a light source directed upon the photoresistive element. Since the absolute resistance of the photoresistive element varies as a function of the intensity of light incident upon it, the resistance of the photoresistive element is made to vary as a function of the output voltage without providing a signal path between the controlled and controlling signals.

Many other objects and advantages of the present invention will become readily apparent as the following detailed description unfolds wherein like numerals denote like parts and in which:

FIGURES 1*a* through 1*f* show various circuit configurations by which a photoresistive element may be used to produce controlled attenuation of an output signal;

Figure 1A:
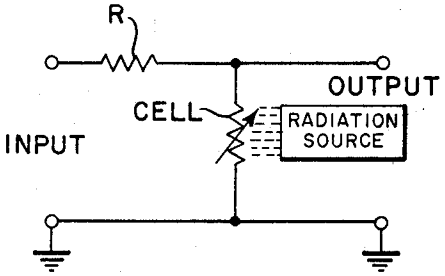

Turning now to the drawings, and more particularly to FIGURES 1*a* through 1*f*, various ways in which the photoresistive element may be connected in a circuit to produce attenuation of the output are shown. FIGURE 1*a* illustrates a shunt arrangement wherein the output signal appears across the photoresistive element. The level of the output signal is a function of the resistance of the photoresistive element and hence an inverse function of the intensity of the radiation source.

Figure 1B:
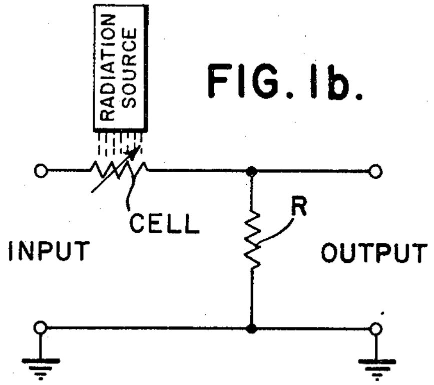
Figure 1C:
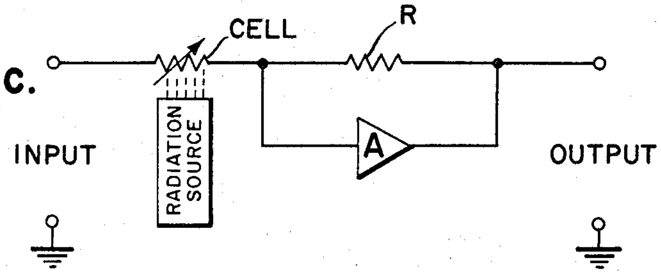
Figure 1D:
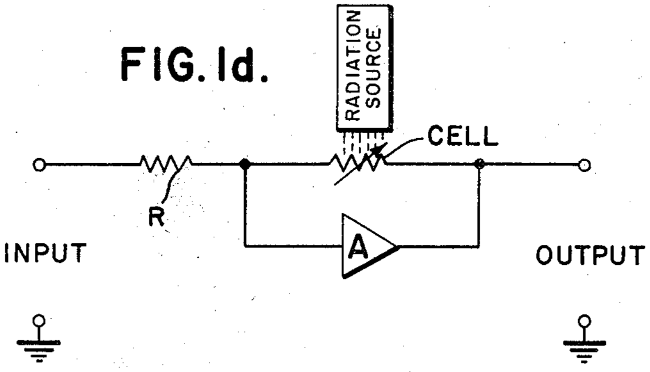
Figure 1E:
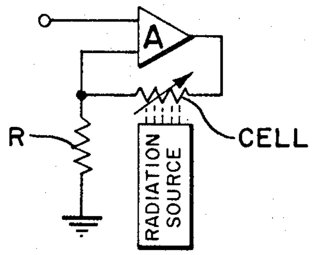
Figure 1F:
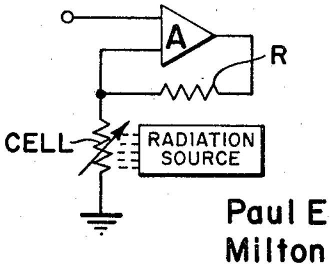

FIGURE 1*b* is similar to FIGURE 1*a* except that the photoresistive element functions as the series resistor and the output signal is taken across a fixed resistor. In this instance the output signal varies as a function of the intensity variation source and inversely as a function of the resistance of the photoresistive element.

The circuits shown in FIGURES 1*c*–1*f* are similar to the ones of FIGURES 1*a* and 1*b* in that each functions as a voltage divider network. The exact mode of operation is apparent upon inspection.

Generally, it would be practical to use the configuration of FIGURE 1*a* in a vacuum tube amplifier whereas the configuration of FIGURE 1*b* would perhaps be more useful in an amplifier utilizing the transistor as the active element. Each of the configurations shown in FIGURES 1*a*–1*f* could, however, be used with either type of amplifier. The choice of configuration used would depend upon the characteristics of the photoconductive resistor and the circuit in which it is to be used. For example, some cells may have an impedance range from 10 kilohms to 100 megohms whereas the impedance range of another type cell may be as low as 60 ohms and have a maximum impedance of considerably less than 1 megohm. The maximum voltage that can be impressed across the photoresistive element without producing distortion is another very important consideration in determining the particular configuration used. These factors must necessarily be considered in conjunction with the impedance level of the circuit in which it is to be used and the amount of attenuation that is required.

Figures 2, 3:
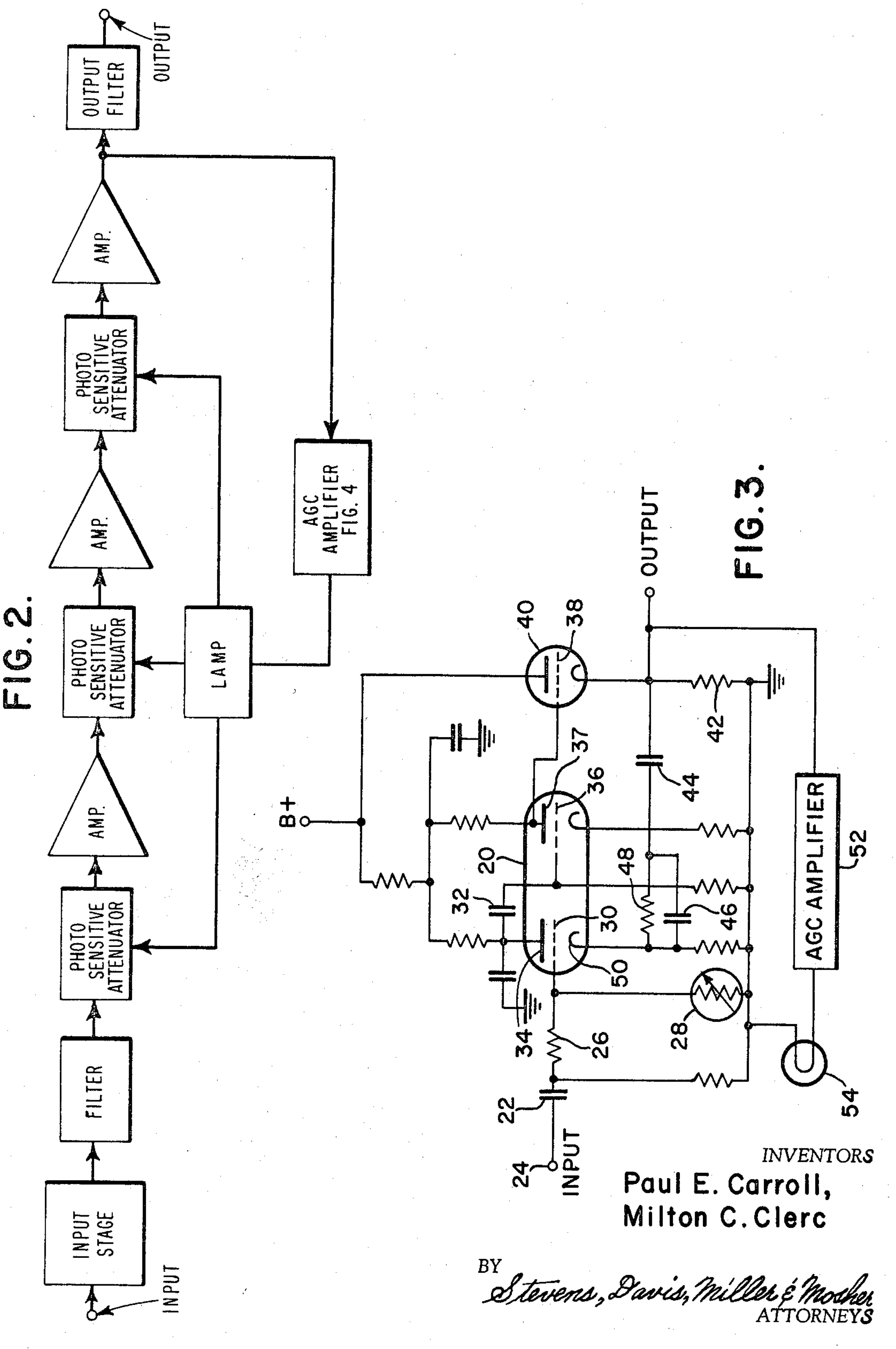
FIGURE 2 is a block diagram of a seismic amplifier system incorporating the present invention.
FIGURE 3 is a schematic illustration of one stage of the amplifier system shown in FIGURE 2 using a photosensitive resistor as a variable electronic attenuator.

Turning now to FIGURE 2 of the drawing, a seismic amplifier incorporating the AGC system of the present invention is shown in block diagram form. The incoming seismic signal passes through an input stage having a fixed, high gain and a filter where the high frequency and very low frequency noise is removed from the signal being processed. The signal is then amplified by three amplifier stages. An attenuator is associated with each amplifier stage and serves to attenuate the signal applied to each amplifier stage. The output of the last amplifier stage is filtered and passed on to suitable recording equipment. The output of the last amplifier stage also drives the AGC amplifier that controls the attenuation of the signal applied to each amplifier stage.

FIGURE 3 of the drawings shows a specific example of one stage of a seismic amplifier incorporating the AGC system of the present invention. The stage of the amplifier includes a dual triode 20. Capacitor 22 is used for coupling the signal from the input terminal 24. Resistor 26 and photoresistive element 28 provide variable attenuation of the input signal before the input signal is applied to the first control grid 30 of the dual triode 20. As is common practice when using dual triodes, capacitor 32 is used to couple the output signal from the plate 34 to the second control grid 36. The output of the second plate 37 is coupled directly to the control grid 38 of triode 40.

The triode 40 is operated as a cathode follower with the output signal taken across the cathode resistor 42. Capacitors 44 and 46 and resistor 48 provide negative feedback from the output of the cathode follower 40 to the cathode 50 of the first part of the dual triode 20. The purpose of this negative feedback is to stabilize and linearize the amplifier rather than function as automatic gain control. The AGC signal is taken from the output of the cathode follower 40 and fed through an AGC amplifier 52.

The AGC amplifier provides power to the lamp 54, the amount of power supplied being determined by the signal level at the output of the cathode follower 40. It is observed that the attenuator configuration shown in FIGURE 1*a* is used in the specific example. Thus, as the output signal level increases, the intensity of the radiation source 54 increases causing the resistance of element 28 to decrease. Less potential is developed across the element 28 thereby decreasing the input voltage to the amplifier stage and, hence, the level of the output signal. If the output signal were less than is desired, the radiation source 54 would be less intense causing the resistance of element 28 to increase thereby producing the desired level of output signal.

Figures 4, 5:
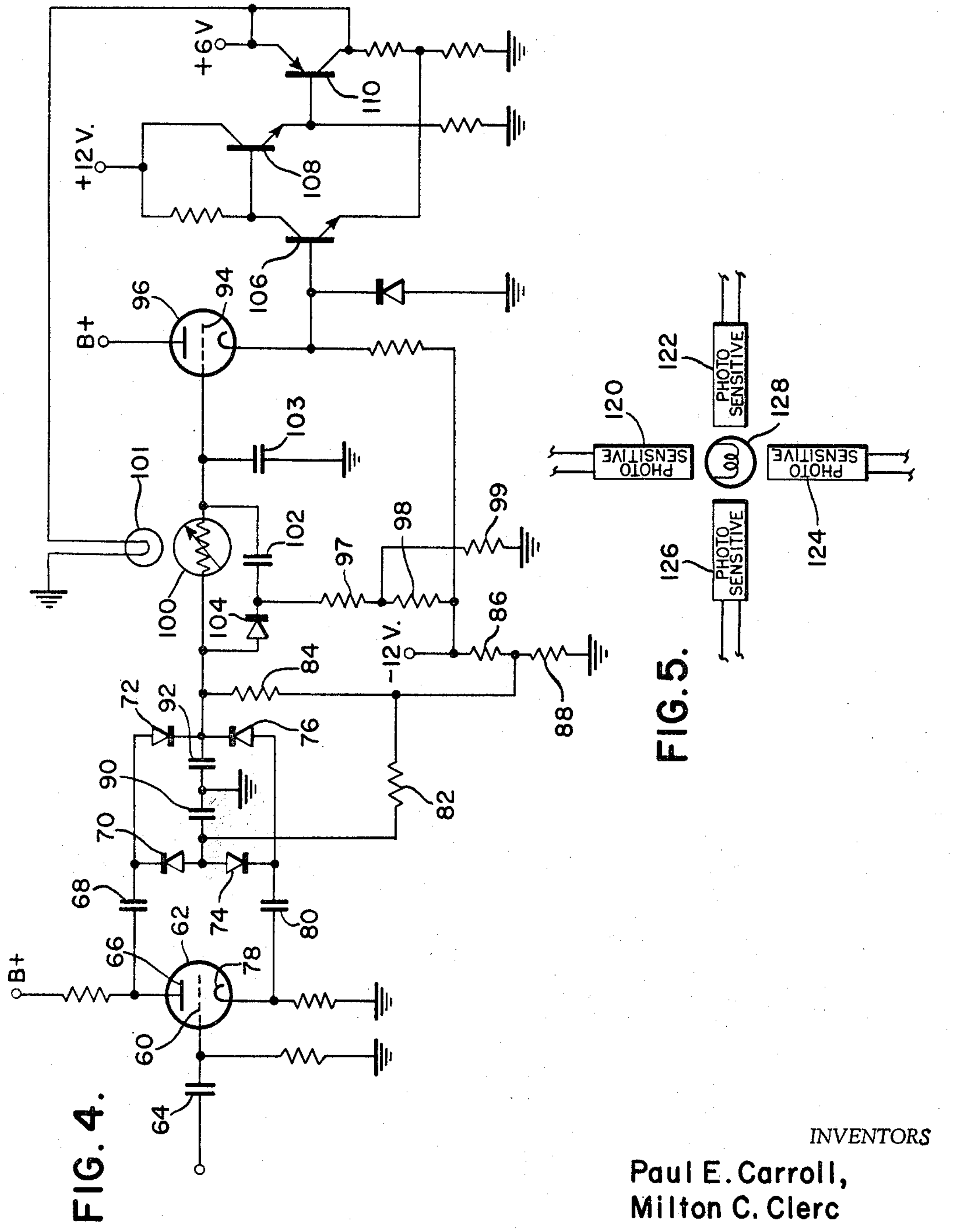
FIGURE 4 is a schematic illustration of an AGC amplifier suitable for controlling a photoresistive element responsive to changes in the output voltage of an amplifier.
FIGURE 5 shows an arrangement by which one source of radiation can control several stages of a seismic amplifier.

An example of a suitable AGC amplifier for use in the present invention is schematically illustrated in FIGURE 4. The output of the last amplifier stage is coupled to the grid 60 of triode 62 through the coupling capacitor 64. The triode 62 is connected as a phase splitter amplifier. This amplifier should have a band pass considerably wider than the seismic amplifier to insure that signals of all frequencies that may occur in the output are controlled. The output from the plate 66 of the triode 72 is coupled through capacitor 68 to one terminal of a bridge type rectifier comprising rectifiers 70, 72, 74, and 76. The output taken from the cathode 78 of the triode 62 is coupled to another leg of the rectifier bridge through capacitor 80. The resistive network composed of resistors 82, 84, 86, and 88 in conjunction with the −12 volt supply provide a bias to the rectifier bridge that establishes an AGC threshold level. Normally, the bridge is biased at a level near the peak voltage of the desired output level. The effect of this bias is to allow the output of the triode 62 to attain a certain predetermined level before AGC action will occur. This also provides stability in the system, a flat AGC taper, and a more constant AGC speed by making the AGC circuit very sensitive to small fluctuations in the output voltage above the bias level. The capacitors 90 and 92 provide additional filtering at low frequencies.

The output on the rectifier bridge is taken from the junction between rectifiers 72 and 76. The output of the bridge is connected to the grid 94 of triode 96 by a resistance-capacitance network including resistors 97, 98 and 99, capacitors 102 and 103 and photoresistive element 100 driven by radiation source 101 that establishes the AGC time constant. It is observed that this photoresistive element is connected in a manner similar to that in FIGURE 1*b*. In other words, the greater the output of the amplifier the greater the intensity of the radiation source and the less the resistance of the photoresistive element. The effect of this photoresistive element connected to provide forward acting AGC is to compensate for the nonlinear nature of the photoresistive elements used. The capacitor 102 and diode 104 function as a lead network to compensate for any delay induced by the various photoresistive elements and radiation source.

The triode 96 and transistors 106, 108, and 110 and the associated components are connected to function as a power amplifier that drives the lamp 101 in response to the developed AGC signal.

If desired, a separate radiation source can be used with each photoresistive element although the most efficient results have been achieved utilizing only one radiation source. Such arrangement is shown schematically in FIGURE 5 wherein four photoresistive elements 120, 122, 124, and 126 are disposed about a single radiation source 128 to receive equal amounts of radiation. Using this arrangement, it is only necessary to supply sufficient power to drive one lamp. Also, it is easier to compensate for the nonlinear action of the devices as a great deal of the nonlinearity is produced by the lamp itself.

Excellent results have been obtained using the specific embodiment shown. It has been found possible to operate with an input signal at each amplifier stage as high as 0.5 volt thereby allowing the maximum signal-to-noise ratio to be increased by more than one order of magnitude. Over-all gains in the order of $5 \times 10^5$ have been achieved with a distortion level almost one order of magnitude better than could be obtained using prior art systems. Axis shift has been virtually eliminated, even at relatively low signal levels.

Obviously the principles of the invention would be applicable to a programmed gain control system, or remote control system as well as an automatic gain control system. Although only a preferred embodiment of the invention has been disclosed, many changes and modifications would be obvious to one skilled in the art and the invention is intended to be limited only by the scope of the appended claim.

What is claimed is:

1. Automatic gain control apparatus for a seismic amplifier system comprising:

(a) a plurality of cascaded seismic amplifier stages each having an input and an output, (b) a source of low frequency signals connected to the input of the first of the amplifier stages, (c) gain control voltage generating means having an input connected to the output of the last of the amplifier stages for providing a voltage which increases as a function of the magnitude of the low frequency signals appearing on such output after such magnitude exceeds a preselected threshold level, (d) amplifying means having an input connected to the output of the gain control voltage generating means, (e) radiation source means connected to the output of the amplifying means to be energized according to the magnitude of the gain control voltage, (f) a plurality of radiation sensitive resistive elements positioned to be illuminated by the radiation source means a different one of said elements being connected in the input of each amplifier stage to attenuate the signals applied to such input in response to the radiation from said radiation source means which impinges on such element, and (g) a radiation sensitive resistor positioned to be illuminated by the radiation source means and connected in the input of the amplifying means to attenuate the gain control voltage applied thereto in an inverse relation to the magnitude of the radiation from said radiation source means which impinges upon the resistor.

References Cited

UNITED STATES PATENTS 3,225,304 12/1965 Richards ---------- 330—59 X

ROY LAKE, *Primary Examiner.*

N. KAUFMAN, *Assistant Examiner.*